United States Patent
Sur et al.

(10) Patent No.: US 6,724,078 B1
(45) Date of Patent: Apr. 20, 2004

(54) ELECTRONIC ASSEMBLY COMPRISING SOLDERABLE THERMAL INTERFACE

(75) Inventors: Biswajit Sur, San Jose, CA (US); Nagesh Vodrahalli, Phoenix, AZ (US); Thomas Workman, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 09/652,430

(22) Filed: Aug. 31, 2000

(51) Int. Cl.⁷ .............................................. H01L 23/12
(52) U.S. Cl. ...................... 257/704; 257/706; 257/707; 257/720; 257/675; 257/779; 257/783; 438/122; 438/125; 438/612; 438/118
(58) Field of Search ................................ 257/704, 706, 257/707, 713, 718, 720, 675, 728, 779, 783; 438/122, 125, 612, 118

(56) References Cited

U.S. PATENT DOCUMENTS

| | | | |
|---|---|---|---|
| 4,561,011 A | | 12/1985 | Kohara et al. ............... 356/81 |
| 4,827,376 A | * | 5/1989 | Voss .......................... 361/388 |
| 5,098,609 A | * | 3/1992 | Iruvanti et al. ............ 252/511 |
| 5,276,289 A | * | 1/1994 | Satoh et al. ................ 257/779 |
| 5,396,403 A | * | 3/1995 | Patel .......................... 257/706 |
| 5,587,882 A | * | 12/1996 | Patel .......................... 257/706 |
| 5,623,394 A | * | 4/1997 | Sherif et al. ............... 257/713 |
| 5,672,548 A | * | 9/1997 | Culnane et al. ............ 257/706 |
| 5,744,863 A | * | 4/1998 | Culnane et al. ............ 257/704 |
| 5,880,524 A | * | 3/1999 | Xie ............................. 257/704 |
| 5,905,636 A | * | 5/1999 | Baska et al. ............... 257/706 |
| 6,091,603 A | * | 7/2000 | Daves et al. ............... 257/675 |
| 6,218,730 B1 | * | 4/2001 | Toy et al. ................... 257/704 |
| 6,281,573 B1 | * | 8/2001 | Atwood et al. ............. 257/706 |
| 6,292,369 B1 | * | 9/2001 | Daves et al. ............... 361/719 |
| 6,294,408 B1 | * | 9/2001 | Edwards et al. ........... 438/121 |
| 6,372,337 B2 | * | 4/2002 | Takahashi et al. ......... 428/328 |

FOREIGN PATENT DOCUMENTS

JP          03142860          6/1991     ........... H01L/23/02

OTHER PUBLICATIONS

Amendola, A., et al., "Cooling Structure for an Integrated Circuit Module", *IBM Technical Disclosure Bulletin*, 23 (2), (Jul. 1980), p. 602 [Abstract].

Miller, R.C., "Structure for achieving thermal enhancement in a semiconductor package", *IBM Technical Disclosure Bulletin*, 23 (6) (Nov. 1980), p. 2308 [Abstract].

* cited by examiner

*Primary Examiner*—David Nelms
*Assistant Examiner*—Andy Huynh
(74) *Attorney, Agent, or Firm*—Schwegman, Lundberg, Woessner & Kluth, P.A.

(57) ABSTRACT

To accommodate high power densities associated with high performance integrated circuits, heat is dissipated from a surface of a die through a solderable thermal interface to a lid or integrated heat spreader. In one embodiment, the die is mounted on an organic substrate using a C4 and land grid array arrangement. In order to maximize thermal dissipation from the die while minimizing warpage of the package when subjected to heat, due to the difference in thermal coefficients of expansion between the die and the organic substrate, a thermal interface is used that has a relatively low melting point in addition to a relatively high thermal conductivity. Methods of fabrication, as well as application of the package to an electronic assembly, an electronic system, and a data processing system, are also described.

52 Claims, 4 Drawing Sheets

ELECTRONIC ASSEMBLY COMPRISING SOLDERABLE THERMAL INTERFACE

TECHNICAL FIELD OF THE INVENTION

Embodiments of the present invention relate generally to electronics packaging. More particularly, the present invention relates to an electronic assembly that includes an integrated circuit package comprising a solderable thermal interface between the integrated circuit and a heat spreader to dissipate heat generated in a high speed integrated circuit, and to manufacturing methods related thereto.

BACKGROUND INFORMATION

Integrated circuits (ICs) are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs on substrates, where each new generation of packaging must provide increased performance while generally being smaller or more compact in size. As the power demands of high performance IC processors approach and even exceed 100 watts per chip, with localized power densities exceeding 200 watts/square centimeter, the heat dissipating capability of the IC package must correspondingly increase.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as ICs, of the system. Some ICs have a relatively large number of input/output (I/O) terminals, as well as a large number of power and ground terminals.

One of the conventional methods for mounting an IC on a substrate is called "controlled collapse chip connect" (C4). In fabricating a C4 package, the electrically conductive terminations or lands (generally referred to as "electrical contacts") of an IC component are soldered directly to corresponding lands on the surface of the substrate using reflowable solder bumps or balls. The C4 process is widely used because of its robustness and simplicity.

As the internal circuitry of ICs, such as processors, operates at higher and higher clock frequencies, and as ICs operate at higher and higher power levels, the amount of heat generated by such IC's can increase to unacceptable levels.

For the reasons stated above, and for other reasons stated below which will become apparent to those skilled in the art upon reading and understanding the present specification, there is a significant need in the art for a method and apparatus for packaging an IC on a substrate that minimizes heat dissipation problems associated with high clock frequencies and high power densities.

DETAILED DESCRIPTION

In the following detailed description of embodiments of the invention, reference is made to the accompanying drawings which form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that logical, mechanical, and electrical changes may be made without departing from the spirit and scope of the present disclosure. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of the present disclosure is defined only by the appended claims.

Embodiments of the present invention provide a solution to thermal dissipation problems that are associated with prior art packaging of integrated circuits that operate at high clock speeds and high power levels by employing a highly conductive solder material as a thermal interface between an IC die and a heat spreader. Various embodiments are illustrated and described herein.

In one embodiment, an IC die is mounted to an organic land grid array (OLGA) substrate using C4 technology. An integrated heat spreader is attached to the back surface of the die using a highly conductive solderable thermal interface material after suitable preparation of the die and heat spreader surfaces. A solderable thermal interface material is selected that has a relatively low melting point, in order to minimize thermal stresses in the package that can be generated, because the silicon die has a relatively low thermal coefficient of expansion (TCE) compared to the TCE of the OLGA substrate. By reducing thermal stresses, the package is less likely to experience warpage when it is subjected to heat, for example during solder reflow.

The solderable thermal interface material also has excellent thermal conductive properties. The integrated heat spreader can also be coupled to the OLGA substrate around the die periphery with a suitable sealant in order to provide mechanical strength.

In addition to the foregoing advantages, the use of a low melting point solder as a thermal interface material avoids many problems associated with the use of polymeric thermal interface materials (e.g. those containing silver or aluminum), such as resin separation, out-gassing, delamination, pump-out, and so forth.

Figure 1:
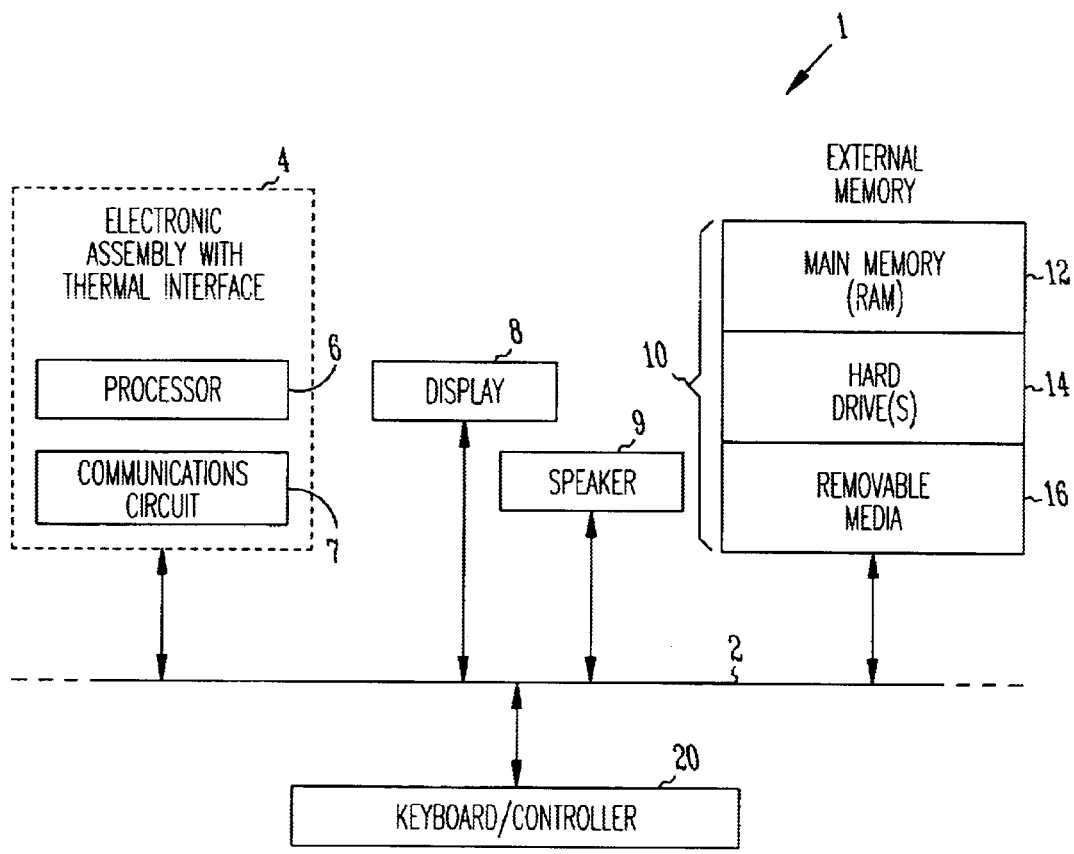
FIG. 1 is a block diagram of an electronic system incorporating at least one electronic assembly with a solderable thermal interface in accordance with one embodiment of the invention.

FIG. 1 is a block diagram of an electronic system 1 incorporating at least one electronic assembly 4 with a solderable thermal interface in accordance with one embodiment of the invention. Electronic system 1 is merely one example of an electronic system in which the present subject matter can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a speaker 9, and a keyboard and/or controller 20, which can include a mouse, trackball, game controller, voice-recognition device, or any other device that permits a system user to input information into and receive information from the electronic system 1.

Figure 2:
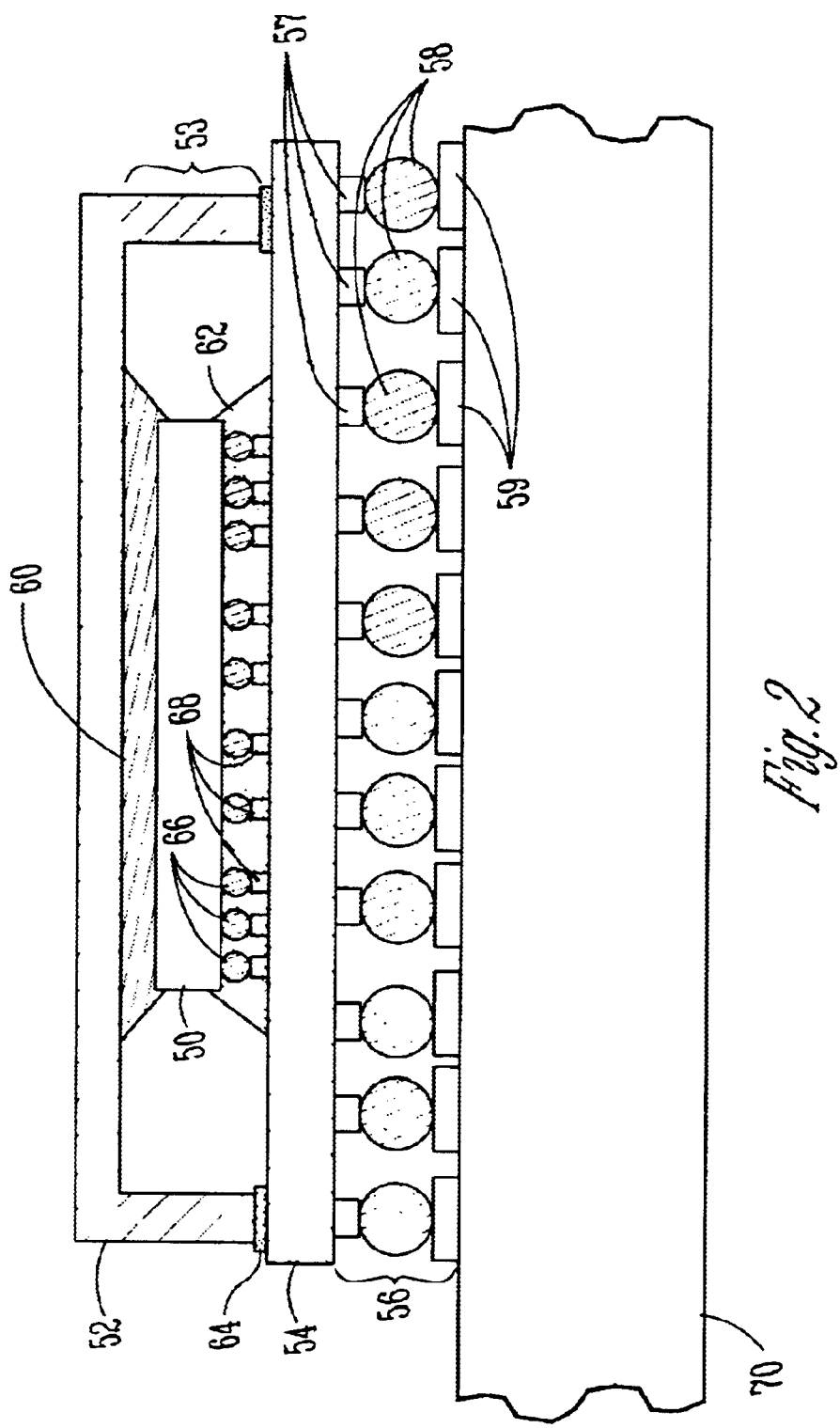
FIG. 2 illustrates a cross-sectional representation of an integrated circuit package, in accordance with one embodiment of the invention.

FIG. 2 illustrates a cross-sectional representation of an integrated circuit (IC) package, in accordance with one embodiment of the invention. The IC package comprises a die 50 mounted on an organic land grid array (OLGA) substrate 54, and a lid or integrated head spreader (IHS) 52. While an OLGA substrate is shown, embodiments of the present invention are not limited to use with an OLGA substrate, and any other type of substrate can be employed.

The IC package illustrated in FIG. 2 can form part of electronic assembly 4 shown in FIG. 1. Die 50 can be of any type. In one embodiment, die 50 is a processor.

In FIG. 2, die 50 comprises a plurality of signal conductors (not shown) that terminate in pads on the bottom surface of die 50 (not shown). These pads can be coupled to corresponding lands 68 representing signal, power, or ground nodes on OLGA substrate 54 by appropriate connections such as C4 solder bumps 66. A suitable underfill 62, such as an epoxy material, can be used to surround C4 solder bumps 66 to provide mechanical stability and strength. Still referring to FIG. 2, lid or IHS 52 forms a cover over die 50. IHS 52 is thermally coupled to a surface of die 50 through a suitable solderable thermal interface 60. Die 50 can thus dissipate a substantial amount of heat through thermal interface 60 to IHS 52. The solderable thermal interface 60 comprises a material that is capable of conducting heat at a relatively high rate, and that has a relatively low melting point to minimize thermal stresses in the package when it is subjected to heat, for example during solder reflow.

IHS 52 can be mechanically supported by coupling its wall or support member 53 to the surface of OLGA substrate 54 through a suitable sealant 64. In one embodiment, the wall or support member 53 is located at the periphery of IHS 52. However, in other embodiments IHS 52 can extend beyond the support member 53. For example, a heat spreader of any shape can be formed as part of or attached to IHS 52, in order to increase the rate of heat dissipation from die 50.

OLGA substrate 54 can be of any type, including a multi-layer substrate. OLGA substrate 54 can be mounted to an additional substrate 70, such as a printed circuit board (PCB) or card. OLGA substrate 54 can comprise, for example, a plurality of lands 57 that can be mechanically and electrically coupled to corresponding lands 59 of substrate 70 by suitable connectors such as ball grid array (BGA) solder balls 58.

While a BGA arrangement 56 is illustrated in FIG. 2 for coupling OLGA substrate 54 to substrate 70, embodiments of the present invention are limited to use with a BGA arrangement, and they can be used with any other type of packaging technology, e.g. land grid array (LGA), chip scale package (CSP), or the like. Further, embodiments of the present invention are not to be construed as limited to use in C4 packages, and thy can be used with any other type of IC package where the herein-described features of the present subject matter provide an advantage.

The fabrication of an IC package comprising a solderable thermal interface 60 will now be described.

Fabrication

In order to successfully fabricate an IC package with the advantages described above, it is important to have a die surface that is readily solderable. It is also important to have an IHS that is readily solderable. In addition, it is important to use a suitable solder material. Further, it is important to utilize a suitable process for forming a reliable thermal interface between the die and the IHS. Each of the above-mentioned factors will now be described in sufficient detail to enable one of o skill in the art to understand and practice the subject matter.

Figure 3:
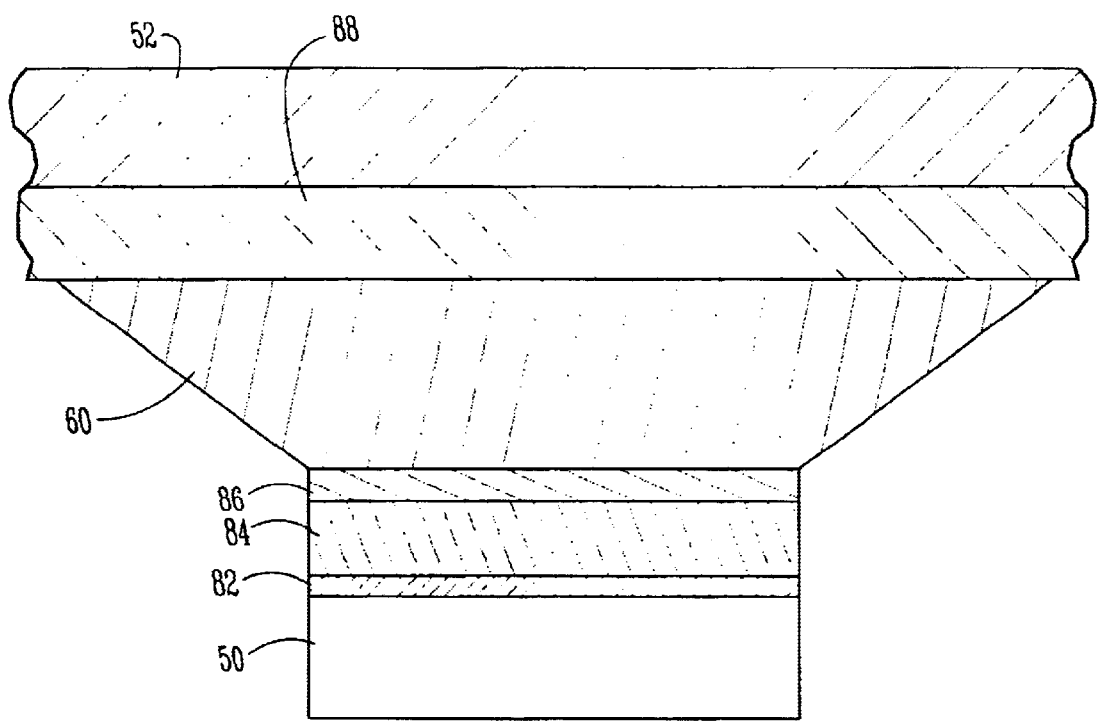
FIG. 3 illustrates a cross-sectional representation of a solderable thermal interface between a die and a lid or integrated heat spreader, in accordance with one embodiment of the invention.

FIG. 3 illustrates a cross-sectional representation of a thermal interface (also referred to herein as a thermally conductive element) 60 between a die 50 and a lid or integrated heat spreader (IRS) 52, in accordance with one embodiment of the invention.

For good solderability of the thermal interface 60 to the die 50, according to one embodiment of the invention, one or more metal layers 82, 84, and 86 are deposited on the die surface that is to be coupled via thermal interface 60 to the IHS 52. Before deposition of the one or more metal layers 82, 84, and/or 86, the wafer surface can be prepared with a sputter etch, if desired, to improve the adhesion of the adhesion layer 82 to the die surface; however, a sputter etch is not essential. Nor is the condition of the wafer surface essential. The wafer surface can be in unpolished, polished, or back-ground form.

Next, an adhesion layer 82 of a metal that adheres well to silicon, silicon oxide, or silicon nitride, such as titanium (Ti), is deposited onto the etched surface. In one embodiment, a 500 Angstrom layer of titanium is sputtered onto the etched surface. Chromium (Cr), vanadium (V), and possibly zirconium (Zr) could be substituted for Ti.

Next, a second metal layer 84, such as nickel-vanadium (NiV), is deposited. In one embodiment, a 3500 Angstrom layer of NiV is sputtered onto the Ti layer. A purpose of layer 84 is to serve as a diffusion barrier to prevent any reaction of solder in the thermal interface 60 with the adhesion layer 82, which could result in possible delamination of the thermal interface 60 from the die 50. Layer 84 is not necessarily required, depending upon the composition of the adhesion layer 82, the solder material in the thermal interface 60, and the thermal treatment during the reflow operation.

Next, a third metal layer 86, such as gold (Au), is deposited. In one embodiment, a 600 Angstrom layer of Au is sputtered onto the NiV layer. Any metal that "wets" the chosen solder material in the thermal interface 60 could be substituted for gold. Nickel is one example.

For good solderability of the thermal interface 60 to the lid or IHS 52, one or more metal or solderable organic layers 88 are deposited onto the appropriate surface of the IHS 52. In one embodiment, IHS 52 comprises copper (Cu); in another embodiment IHS 52 comprises aluminum-silicon-carbide (AlSiC). For an IHS 52 comprising either Cu or AlSiC, a 2-5 micron thick layer 88 of Ni is deposited on the lower surface of IHS 52. Electroless Ni plating is carried out in a Niklad 767 bath using a medium force solution. Any metal that "jets" the chosen solder material in the thermal interface 60 could be substituted for nickel. Gold is one example. A combination of metals or alloys could also be substituted for the single layer 88 shown in FIG. 3.

For a suitable solder material, any of the solder alloys, or a combination thereof, listed in Table 1 would be effective. All are commercially available from Indium Corporation of America, Utica, N.Y. under the corresponding Indalloy® No. In one embodiment, the solder can be integrated with a no-clean flux vehicle to form a solder paste with an 89% loading of the selected solder alloy.

TABLE 1

| Composition | Liquidus (° C.) | Solidus (° C.) | Thermal Conductivity Watts/Meter ° C. | Indalloy No. |
|---|---|---|---|---|
| 58% Bismuth (Bi)/42% Tin (Sn) | 138 | 138 | 19 | 281 |
| 97% Indium (In)/3% Silver (Ag) | 143 | 143 | 73 | 290 |
| 80% In/15% Lead (Pb)/ 5% Ag | 154 | 149 | 43 | 2 |
| 100% In | 157 | 157 | 86 | 4 |

A suitable process for forming a reliable solderable thermal interface between the die and the IHS will now be described. Solder paste is first applied to the back side of the die. Alternatively, the solder paste could be applied to the surface of IHS 52 that faces the back side of the die. Then a suitable sealant (64, FIG. 2) is applied to the OLGA substrate 54 where the periphery or boundary of IHS 52 will make contact when it is positioned over the die 50. Next, the IHS 52 is placed, and an appropriate force can be applied, for example using a spring, to hold IHS 52 in position. The package is then put into a suitable heating environment, such as a flow furnace, for solder reflow. In one embodiment of the method, during solder reflow, the maximum zone temperature in the furnace is maintained at liquidus of the solder material +30° C., and the time above liquidus is approximately 60 seconds. Following solder join of the thermal interface, the sealant at the IHS boundary is cured in a conventional oven.

The above-described choice of materials, geometry, number of layers, etching, deposition, and assembly can all be varied by one of ordinary skill in the art to optimize the thermal performance of the package. However, an unoptimized embodiment of the present invention has been demonstrated to provide a substantial thermal margin for IC's operating at high clock frequencies and high power levels, and without any adverse impact on package reliability.

Any suitable method, or combination of different methods, for depositing the metal layers can be used, such as sputtering, vapor, electrical, screening, stenciling, chemical including chemical vapor deposition (CVD), vacuum, and so forth.

The particular implementation of the IC package is very flexible in terms of the orientation, size, number, and composition of its constituent elements. Various embodiments of the invention can be implemented using various combinations of substrate technology, IHS technology, thermal interface material, and sealant to achieve the advantages of the present disclosure. The structure, including types of materials used, dimensions, layout, geometry, and so forth, of the IC package can be built in a wide variety of embodiments, depending upon the requirements of the electronic assembly of which it forms a part.

FIGS. 2 and 3 are merely representational and are not drawn to scale. Certain proportions thereof may be exaggerated, while others may be minimized. FIGS. 2 and 3 are intended to illustrate various implementations of the subject matter that can be understood and appropriately carried out by those of ordinary skill in the art.

Figure 4:
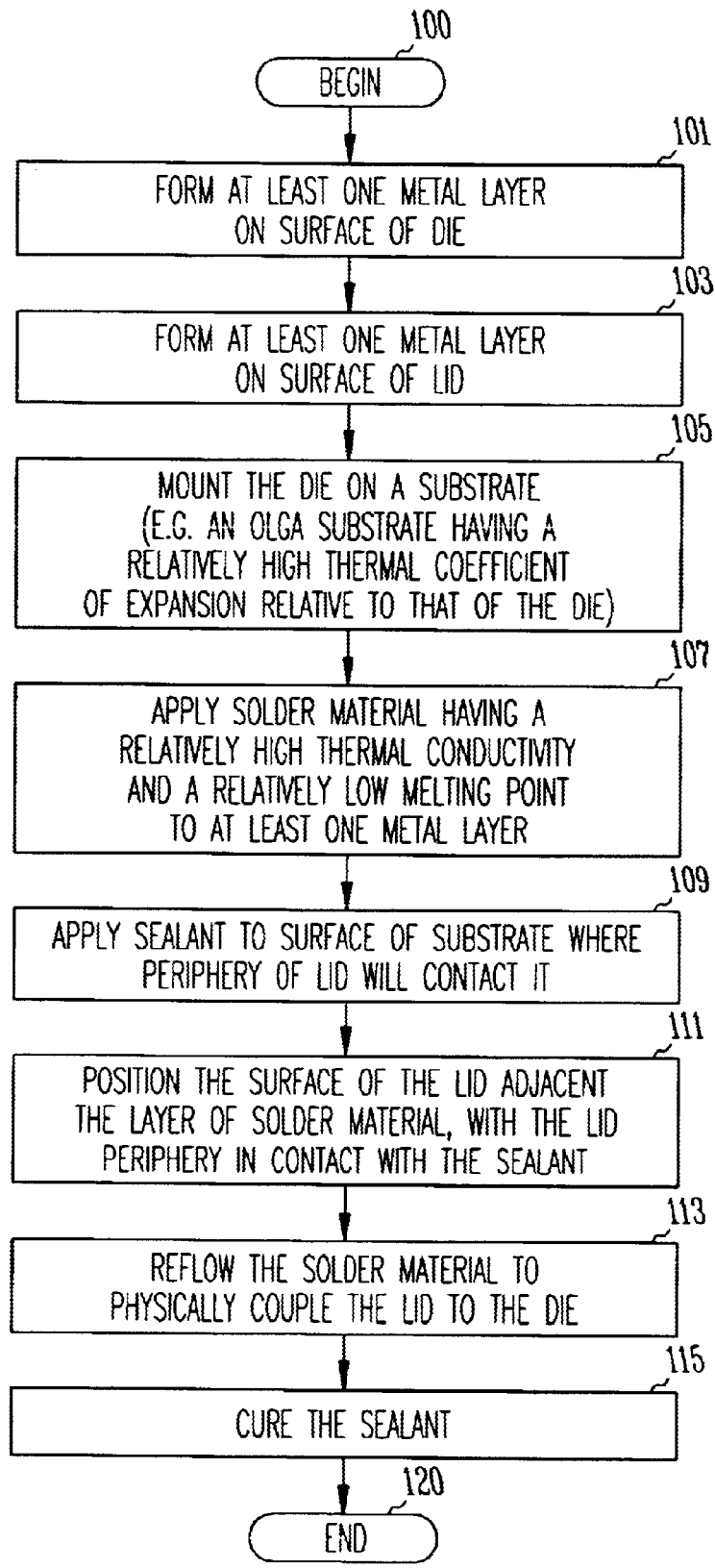
FIG. 4 is a flow diagram of a method of packaging a die, in accordance with one embodiment of the invention.

FIG. 4 is a flow diagram of a method of packaging a die, in accordance with one embodiment of the invention. The method begins at 100.

In 101, at least one metal layer is formed on a surface of a die. In one embodiment, as described above, individual layers of titanium, nickel-vanadium, and gold are successively deposited on the upper surface of die 50 (FIG. 3). One or more alloys of these metals could also be used.

In 103, at least one metal layer is formed on a surface of the lid. In one embodiment, as described above, a layer of nickel is deposited on the lower surface of lid or IHS 52 (FIG. 3).

In 105, the die is mounted on a substrate. In one embodiment, as described above, the substrate is an organic substrate, and the die is C4 mounted using a land grid array (LGA) arrangement. It is to be noted that substrates comprising one or more organic materials, such as epoxies, acrylates, polyimides, polyurethanes, polysulfides, resin-glass weave (e.g. FR-4), nylons, and other similar materials, have a relatively high thermal coefficient of expansion compared with that of the die.

In 107, solder material having a relatively high thermal conductivity and a relatively low melting point is applied to the at least one metal layer of the die. In securing the IHS to the die, it is desirable to employ a solder material having a relatively low melting point to minimize warpage problems when the package is subjected to heat. In one embodiment, as described above, the solder material is any of those listed in Table 1; however, other solder materials besides those listed in Table 1 could be used, provided that they have the qualities previously mentioned. Alternatively, the solder material could be applied to the at least one metal layer on the surface of the lid. The solder material can be applied at any suitable stage in the fabrication process.

In 109, a suitable sealant is applied to the surface of the substrate where the support member 53 (FIG. 2) of IHS 52 will contact it.

In 111, the IHS is placed and aligned so that the inner surface of the IHS contacts the layer of solder material and, concurrently, the support member 53 of IHS 52 contacts the sealant. A spring (not shown) is also placed to secure the assembly with respect to an assembly carrier (not shown).

In 113, the solder material is melted or reflowed by heating so that, when it has cooled, the IHS 52 is physically and thermally coupled to the upper surface of the top metal layer 86 (FIG. 3) on die 50.

In 115, the sealant is cured, for example, by heating, to provide mechanical coupling of the assembly. Post cure, the securing spring is removed from the assembly carrier. The method ends in 120.

The operations described above with respect to the methods illustrated in FIG. 4 can be performed in a different order from those described herein. For example, it will be understood by those of ordinary skill that 103 could be carried out prior to 101, that 107 could be carried out prior to 105, and 109 could be carried out prior to 107.

The present subject matter provides for an electronic assembly and methods of manufacture thereof that minimize thermal dissipation problems associated with high power delivery. An electronic system and/or data processing system that incorporates one or more electronic assemblies that utilize the present subject matter can handle the relatively high power densities associated with high performance integrated circuits, and such systems are therefore more commercially attractive.

As shown herein, the present subject matter can be implemented in a number of different embodiments, including an assembly for a die, in integrated circuit package, an electronic assembly, an electronic system, a data processing system, and a method for packaging an integrated circuit. Other embodiments will be readily apparent to those of ordinary skill in the art. The elements, materials geometries, dimensions, and sequence of operations can all be varied to suit particular packaging requirements.

Although specific embodiments have bees illustrate and described herein, it will be appreciated by those of ordinary skill in the art that any arrangement that is calculated to achieve the same purpose may be substituted for the specific embodiment shown This application is intended to cover any adaptations or variations of the present subject matter. Therefore, it is manifestly intended that embodiments of this invention be limited only by the claims and the equivalents thereof.

What is claimed is:

1. An assembly comprising:
   a die having a surface;
   an adhesion layer of metal coupled to the surface;
   a solder-wettable layer coupled to the adhesion layer;
   a lid; and
   a solderable thermally conductive element to couple the lid to the solder-wettable layer.

2. The assembly recited in claim 1 wherein the lid comprises material from the group consisting of copper and aluminum-silicon-carbide.

3. The assembly recited in claim 1 wherein the solderable thermally conductive element comprises material, including one or more alloys, from the group consisting of tin, bismuth, silver, indium, and lead.

4. The assembly recited in claim 1 wherein the lid comprises at least one metal or organic layer to which the thermally conductive element can be coupled.

5. The assembly recited in claim 4 wherein the at least one metal or organic layer comprises nickel or gold.

6. The assembly recited in claim 1 and further comprising:
   a diffusion layer between the adhesion layer and the solder-wettable layer.

7. The assembly recited in claim 6 wherein the layers comprise material, including one or more alloys, from the group consisting of titanium, chromium, zirconium, nickel, vanadium, and gold.

8. The assembly recited in claim 6 wherein the diffusion layer comprises material, including one or more alloys, from the group consisting of titanium, chromium, zirconium, nickel, vanadium, and gold.

9. The assembly recited in claim 6 wherein the diffusion layer comprises nickel-vanadium.

10. The assembly recited in claim 1 wherein the solderable thermally conductive element has a liquidus temperature of 150 degrees Centigrade or less.

11. The assembly recited in claim 1 wherein the solderable thermally conductive element has a liquidus temperature of 140 degrees Centigrade or less.

12. The assembly recited in claim 1 wherein the solderable thermally conductive element has a liquidus temperature in the range of 138 to 157 degrees Centigrade.

13. The assembly recited in claim 1 wherein the adhesion layer comprises material, including one or more alloys, from the group consisting of titanium, chromium, zirconium, nickel, vanadium, and gold.

14. The assembly recited in claim 1 wherein the adhesion layer comprises titanium.

15. The assembly recited in claim 1 wherein the solder-wettable layer comprises material, including one or more alloys, from the group consisting of titanium, chromium, zirconium, nickel, vanadium, and gold.

16. The assembly recited in claim 1 wherein the solder-wettable layer comprises one of nickel and gold.

17. An integrated circuit package comprising:
   a substrate;
   a die positioned on a surface of the substrate, the die having a back surface;
   an adhesion layer of metal formed on the back surface;
   a solder-wettable layer formed on the adhesion layer;
   a lid positioned over the die; and
   a solderable thermally conductive element coupling the solder-wettable layer and the lid.

18. The integrated circuit package recited in claim 17 wherein the lid comprises a support member coupled to the substrate.

19. The integrated circuit package recited in claim 17 wherein the lid comprises material from the group consisting of copper and aluminum-silicon-carbide.

20. The integrated circuit package recited in claim 17 wherein the lid comprises at least one metal or organic layer to which the thermally conductive element is coupled.

21. The integrated circuit package recited in claim 20 wherein the at least one metal or organic layer comprises nickel or gold.

22. The integrated circuit package recited in claim 17 wherein the solderable thermally conductive element comprises material, including one or more alloys, from the group consisting of tin, bismuth, silver, indium, and lead.

23. The integrated circuit package recited in claim 17 wherein the substrate is an organic substrate and wherein the die is coupled to the substrate through a land grid array.

24. The integrated circuit package recited in claim 17 and further comprising:
a diffusion layer between the adhesion layer and the solder-wettable layer.

25. The integrated circuit package recited in claim 24 wherein the layers comprise material, including one or more alloys, from the group consisting of titanium, chromium, zirconium, nickel, vanadium, and gold.

26. The integrated circuit package recited in claim 17 wherein the solderable thermally conductive element has a liquidus temperature in the range of 138 to 157 degrees Centigrade.

27. An electronic assembly comprising:
at least one integrated circuit package comprising:
a substrate;
a die positioned on a surface of the substrate, the die having a back surface
an adhesion layer of metal formed on the back surface;
a solder-wettable layer formed on the adhesion layer;
a lid positioned over the die; and
a solderable thermally conductive element coupling the solder-wettable layer and the lid.

28. The electronic assembly recited in claim 27 wherein the lid comprises a support member coupled to the substrate.

29. The electronic assembly recited in claim 27 wherein the solderable thermally conductive element comprises material, including one or more alloys, from the group consisting of tin, bismuth, silver, indium, and lead.

30. The electronic assembly recited in claim 27 wherein the substrate is an organic substrate and wherein the die is coupled to the substrate through a land rid array.

31. The electronic assembly recited in claim 27 and further comprising:
a diffusion layer between the adhesion layer and the solder-wettable layer.

32. The electronic assembly recited in claim 31 wherein the layers comprise material, including one or more alloys, from the group consisting of titanium, chromium. zirconium, nickel, vanadium, and gold.

33. An electronic system comprising an electronic assembly having at least one integrated circuit package comprising:
a substrate;
a die positioned on a surface of the substrate, the die having a back surface;
an adhesion layer of metal formed on the back surface;
a solder-wettable layer formed on the adhesion layer,
a lid positioned over the die; and
a solderable thermally conductive element coupling the solder-wettable layer and the lid.

34. The electronic system recited in claim 33 wherein the solderable thermally conductive element comprises material, including one or more alloys, from the group consisting of tin, bismuth, silver, indium, and lead.

35. The electronic system recited in claim 33 wherein the substrate is an organic substrate, wherein the die is coupled to the substrate through a land grid array, and wherein the lid comprises a support member coupled to the substrate.

36. The electronic system recited in claim 33 and further comprising:
a diffusion layer between the adhesion layer and the solder-wettable layer.

37. The electronic system recited in claim 36 wherein the layers comprise material, including one or more alloys, from the group consisting of titanium, chromium, zirconium, nickel, vanadium, and gold.

38. An assembly comprising:
a die having a surface;
an adhesion layer of metal formed on the surface; and
a solder-wettable layer formed on the adhesion layer to receive a solderable thermally conductive element.

39. The assembly recited in claim 38 wherein the adhesion layer comprises material, including one or more alloys, from the group consisting of titanium, chromium, zirconium, nickel, vanadium, and gold.

40. The assembly recited in claim 38 wherein the adhesion layer comprises titanium.

41. The assembly recited in claim 38 wherein the solder-wettable layer comprises material, including one or more alloys, from the group consisting of titanium, chromium, zirconium, nickel, vanadium, and gold.

42. The assembly recited in claim 38 wherein the solder-wettable layer comprises one of nickel and gold.

43. The assembly recited in claim 38 wherein the solderable thermally conductive element comprises material, including one or more alloys, from the group consisting of tin, bismuth, silver, indium, and lead.

44. The assembly recited in claim 38 wherein the solderable thermally conductive element has a liquidus temperature in the range of 138 to 157 degrees Centigrade.

45. The assembly recited in claim 38 and further comprising:
a diffusion layer formed between the adhesion layer and the solder-wettable layer.

46. The assembly recited in claim 45 wherein the diffusion layer comprises material, including one or more alloys, from the group consisting of titanium, chromium, zirconium, nickel, vanadium, and gold.

47. The assembly recited in claim 45 wherein the diffusion layer comprises nickel-vanadium.

48. An assembly comprising:
a die having a surface;
an adhesion layer of metal coupled to the surface;
a solder-wettable layer coupled to the adhesion layer;
a lid; and
a thermal interface of solder material to couple the lid to the solder-wettable layer.

49. The assembly recited in claim 48 wherein the solder material comprises material, including one or more alloys, from the group consisting of tin, bismuth, silver, indium, and lead.

50. The assembly recited in claim 48 wherein the solder material has a liquidus temperature of 150 degrees Centigrade or less.

51. The assembly recited in claim 48 wherein the solder material has a liquidus temperature of 140 degrees Centigrade or less.

52. The assembly recited in claim 48 wherein the solder material has a liquidus temperature in the range of 138 to 157 degrees Centigrade.

* * * * *

UNITED STATES PATENT AND TRADEMARK OFFICE
CERTIFICATE OF CORRECTION

PATENT NO. : 6,724,078 B1
DATED : April 20, 2004
INVENTOR(S) : Sur et al.

It is certified that error appears in the above-identified patent and that said Letters Patent is hereby corrected as shown below:

Title page,
Item [56], References Cited, U.S. PATENT DOCUMENTS, delete "257/706" and insert -- 361/705 --, therefor.

Column 9,
Line 41, delete "rid" and insert -- grid --, therefor.
Line 49, delete "." and insert -- , --, therefor.
Line 57, delete "," and insert -- ; --, therefor.

Signed and Sealed this

Fifteenth Day of February, 2005

JON W. DUDAS
*Director of the United States Patent and Trademark Office*